United States Patent [19]

Corry

[11] Patent Number: 5,500,811
[45] Date of Patent: Mar. 19, 1996

[54] FINITE IMPULSE RESPONSE FILTER

[75] Inventor: Alan G. Corry, Santa Clara, Calif.

[73] Assignee: MicroUnity Systems Engineering, Inc., Sunnyvale, Calif.

[21] Appl. No.: 377,096

[22] Filed: Jan. 23, 1995

[51] Int. Cl.$^6$ .............................. G06F 15/31; G06F 7/38
[52] U.S. Cl. ..................................... 364/724.16; 364/754
[58] Field of Search ..................................... 364/754, 757, 364/760, 736, 724.16

[56]                References Cited

U.S. PATENT DOCUMENTS

| | | | |
|---|---|---|---|
| 3,926,367 | 12/1975 | Bond et al. | 364/754 |
| 4,747,067 | 5/1988 | Jagodnik, Jr. et al. | 364/748.5 |
| 5,297,069 | 3/1994 | Asato et al. | 364/724.16 |

OTHER PUBLICATIONS

Mactaggart, I. R., et al., "Radix–2 FFT Butterfly Processor Using Distributed Arithmetic", *Electronic Letters*, vol. 19, No. 2 (1983).

*Primary Examiner*—Tan V. Mai
*Attorney, Agent, or Firm*—Burns, Doane, Swecker & Mathis

[57] ABSTRACT

A compact Finite Impulse Response (FIR) filter using one or both of a compact address sequencer and a compact multiplier/accumulator. The address sequencer exploits certain symmetry properties existing between different phases of a polyphase FIR filter in order to reduce coefficient storage and simplify address sequencing. The multiplier/accumulator is capable of performing two multiply/accumulate operations per clock cycle, avoiding in certain instances the need to add a second multiplier/accumulator. The area required to realize a FIR filter for performing real-time filter is therefore reduced.

20 Claims, 9 Drawing Sheets

FINITE IMPULSE RESPONSE FILTER

BACKGROUND OF THE INVENTION

1. Field of the Invention

The present invention generally relates to digital filters and, more particularly, to Finite Impulse Response (FIR) filters.

2. State of the Art

In conventional practice, computations involved in realizing a FIR filter have been memory-access intensive. One data output point of a FIR filter is calculated as $$Y_1 = \sum_{i=1}^{N} A_i X_i = A_1 X_1 + \ldots + A_N X_N$$

and a succeeding output data point is calculated as $$Y_2 = \sum_{i=1}^{N} A_i X_{i+1} = A_1 X_2 + \ldots + A_N X_{N+1}$$

where $A_i$ is one of a series of coefficients defining a windowing function of the filter and $X_i$ is one of a series of input data points.

Figure 1:
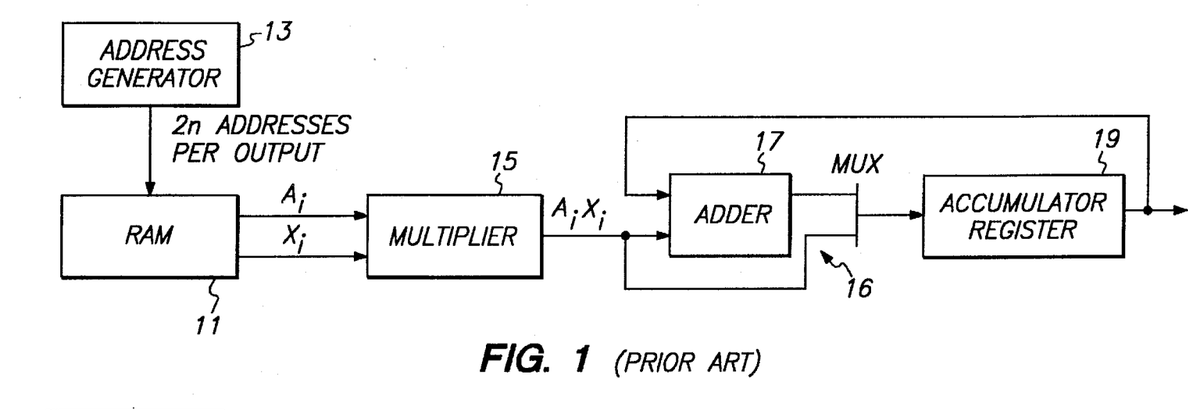
FIG. 1 is a block diagram of a first circuit, according to the prior art, for realizing a FIR filter.

FIG. 1 shows a known system for performing the foregoing computations. In the system, the coefficients $A_i$ and the input data points $X_i$ are stored in a random access memory 11. The RAM 11 is addressed by an address generator 13 to output corresponding $A_i$ and $X_i$ to a multiplier 15 to form the product $A_i X_i$. The product $A_i X_i$ is input to either an adder 17 or, in the case i=1, to an accumulator register 19 through a multiplexer 16. When i≠1, the previous sum $$\sum_{j=1}^{i} A_j X_j$$

stored in the accumulator register 19 is added to the current product $A_i X_i$ in the adder 17 and the cumulative result is stored in the accumulator register 19 through the multiplexer 16. After the sum of the N products has been accumulated in the accumulator register 19, the contents of the accumulator register 19 is output as an output data point. In practice, the coefficients $A_i$ may either be fixed in the case of a non-adaptive filter or may be varied between the calculation of output data points in the case of an adaptive filter.

The system of FIG. 1 requires the address generator 13 to generate 2N addresses per output data point despite the fact that of the 2N operands involved in the calculation, only one of the operands, a new input data point, may differ from the operands involved in the previous calculation.

Figure 2:
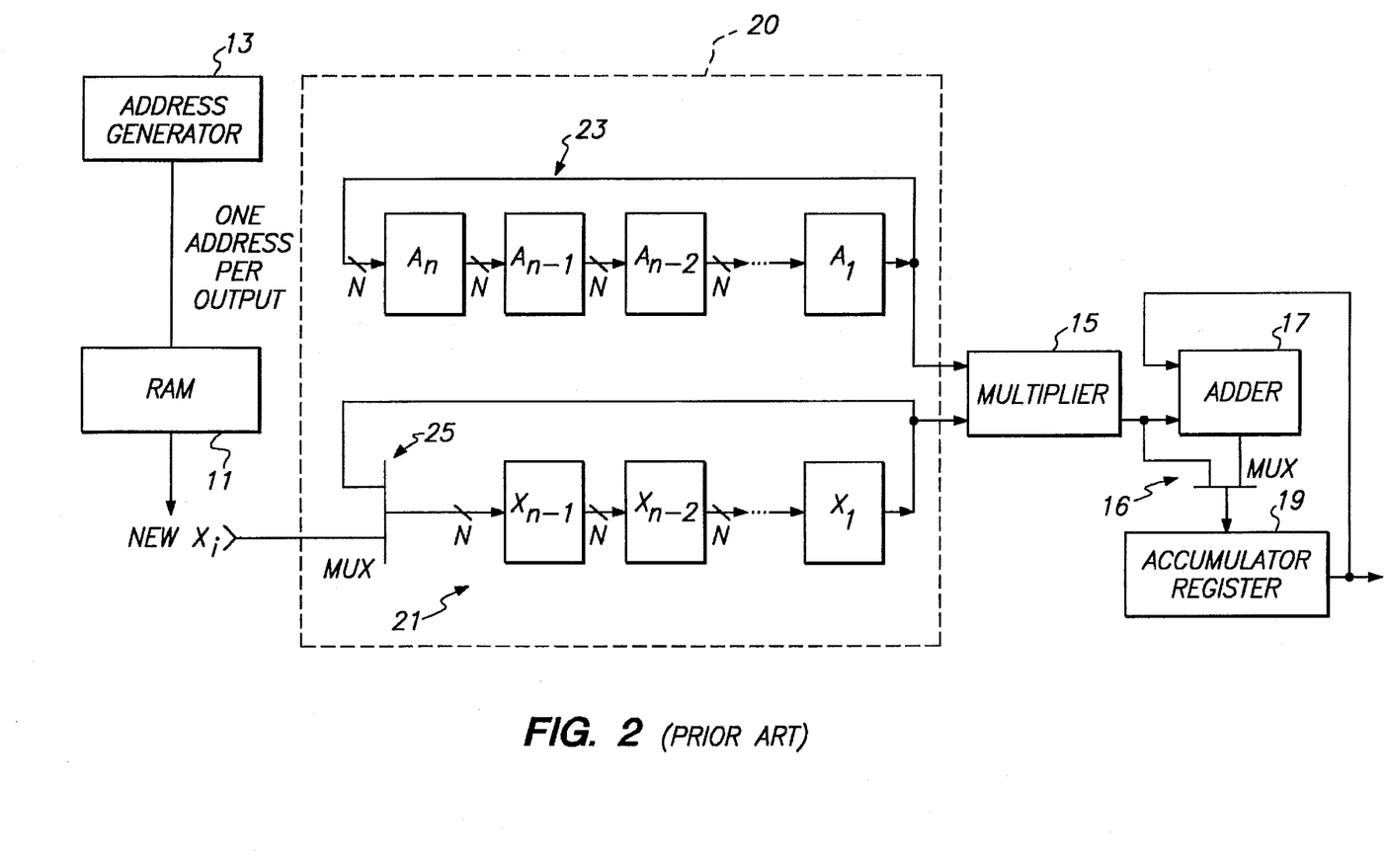
FIG. 2 is a block diagram of a second circuit, according to the prior art, for realizing a FIR filter.

To address the foregoing problem, various modifications to the basic circuit arrangement of FIG. 1 have been proposed. For example, in U.S. Pat. No. 5,297,069, incorporated herein by reference, a circuit is disclosed for realizing a FIR filter that is similar to the circuit of FIG. 1 except that it additionally includes a buffer memory 20 between the RAM 11 and the multiplier 15, as shown in FIG. 2. Output data points of a digital filter are calculated by storing input data points in an addressable memory and accessing the addressable memory to supply a new input data point exactly once for each output data point after a first output data point and storing each input data point in a first recirculating memory for so long as that input data point is needed to calculate a next output data point. The input data points stored in the first recirculating memory (recirculating shift register 21) are used to calculate output data points. Furthermore, coefficients are stored in a second recirculating memory (recirculating shift register 23) and used to calculate the output data points. The recirculating shift register 21 has one less stage than the recirculating shift register 23 in order to "shift" the series of input data points $X_i$ with respect to the series of coefficients $A_i$. In the circuit of FIG. 2, only one memory access is required per output data point.

The circuit of FIG. 2 can be modified to realize special cases of the general FIR filter in a computationally efficient manner. For example, in the case of an odd FIR filter, even-indexed coefficients $A_2$, $A_4$, $A_6$ ... are uniformly zero. Therefore, imagining the series of coefficients being "shifted across" the longer series of input data points after the calculation of each output data point, the zero even-indexed coefficients will first be aligned with even-indexed input data points, then with odd-indexed input data points, then again with even-indexed input data points, and so forth such that half the $X_i$'s are not used to calculate each output. The $X_i$'s can therefore be split into two recirculating shift registers, one holding even-indexed $X_i$ and the other holding odd-indexed $X_i$. The shift registers are then used alternately for every other output calculation.

The circuit of FIG. 2 may also be modified to realize a symmetric FIR filter. In a symmetric FIR filter, the first and last coefficients $A_1$ and $A_n$ are equal as are the second and next to last coefficients $A_2$ and $A_{n-1}$, and so forth. To realize a symmetric FIR filter in a computationally efficient manner, only one of each pair of equal coefficients is stored and the input data points corresponding to the pair of equal coefficients are added and multiplied by the single stored coefficient since $A_1 X_1 + A_n X_n = A_1(X_1 + X_n)$ for $A_1 = A_n$. Modified circuits for realizing odd and symmetric FIR filters are described in the aforementioned U.S. Pat. No. 5,297,069.

Special forms of the symmetric FIR filter include the polyphase interpolating symmetric FIR filter and the polyphase decimating symmetric FIR filter. In the polyphase interpolating symmetric FIR filter the N input samples $X_i$ are composed of recurring sequences of one non-zero sample followed by D-1 zero samples. In the polyphase decimating symmetric FIR filter the N input samples $X_i$ are composed of recurring sequences of one wanted sample followed b samples. In both cases, since it is known a priori that the result of most multiplies will either be zero or will be "thrown away", this characteristic of the input samples allows the N-point convolution to be rewritten as D N/D-point convolutions. Take for example the case of a 16-point interpolating symmetric filter with the following coefficients and input sequence:

TABLE I

| COEFFICIENTS | $A_0$ | $A_1$ | $A_2$ | $A_3$ | $A_4$ | $A_5$ | $A_6$ | $A_7$ | $A_7$ | $A_6$ | $A_5$ | $A_4$ | $A_3$ | $A_2$ | $A_1$ | $A_0$ |
|---|---|---|---|---|---|---|---|---|---|---|---|---|---|---|---|---|
| INPUT SEQUENCE | 0 | 0 | 0 | $X_3$ | 0 | 0 | 0 | $X_2$ | 0 | 0 | 0 | $X_1$ | 0 | 0 | 0 | $X_0$ |

Because of the characteristics of the input sequence, the N=16-point convolution can be rewritten as N/D (16/4 =4) four-point convolutions. In particular, note that as the data input sequence is "shifted across" the coefficient sequence, the coefficients to be multiplied by non-zero data values occur in repeating groups of four, i.e., $\{A_0, A_4, A_7, A_3\}$, $\{A_3, A_7, A_4, A_0\}$, $\{A_2, A_6, A_5, A_1\}$ and $\{A_1, A_5, A_6, A_2\}$. The convolution may therefore be written as follows:

$$\begin{aligned} f &= f_0 \text{ then } f_1 \text{ then } f_2 \text{ then } f_3 \\ &= A_0X_0 + A_4X_1 + A_7X_2 + A_3X_3 \\ &\quad \text{then } A_3X_1 + A_7X_2 + A_4X_3 + A_0X_4 \\ &\quad \text{then } A_2X_1 + A_6X_2 + A_5X_3 + A_1X_4 \\ &\quad \text{then } A_1X_1 + A_5X_2 + A_6X_3 + A_2X_4 \end{aligned}$$

Figure 3:
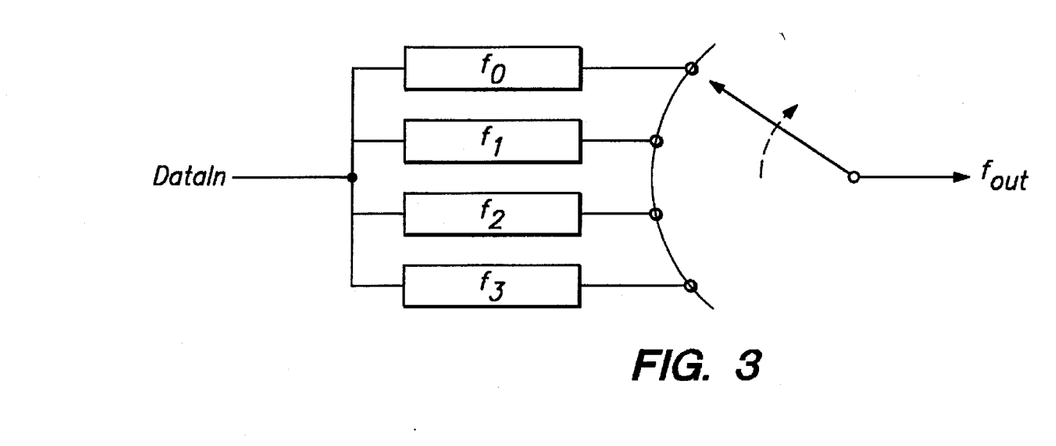
FIG. 3 is a generalized block diagram of a conventional polyphase interpolating filter.

A generalized block diagram of a polyphase interpolating filter is shown in FIG. 3. The input data points are input in common to the individual filter phases s $f_0$, $f_1$, $f_2$ and $f_3$. A commutator is used to sequentially select the output point of one of the filter phases as the output point of the overall polyphase interpolating filter.

In the case of a polyphase decimating filter, on the other hand, the N-point convolution to be again be rewritten as D N/D-point convolutions, but the filter utilizes a different structure. Take for example the case of a 16-point, decimate-by-four symmetric filter with the following coefficients and input sequence:

TABLE II

| COEFFICIENTS | $A_0$ | $A_1$ | $A_2$ | $A_3$ | $A_4$ | $A_5$ | $A_6$ | $A_7$ | $A_7$ | $A_6$ | $A_5$ | $A_4$ | $A_3$ | $A_2$ | $A_1$ | $A_0$ |
|---|---|---|---|---|---|---|---|---|---|---|---|---|---|---|---|---|
| INPUT SEQUENCE | $X_{15}$ | $X_{14}$ | $X_{13}$ | $X_{12}$ | $X_{11}$ | $X_{10}$ | $X_9$ | $X_8$ | $X_7$ | $X_6$ | $X_5$ | $X_4$ | $X_3$ | $X_2$ | $X_1$ | $X_0$ |

Because of the characteristics of the input sequence, the N=16-point convolution can be rewritten as N/D (16/4=4) four-point convolutions. In particular, note that as the data input sequence is "shifted across" the coefficient sequence, for each shift the results of which are used, three additional shifts occur, both before and after, the results of which are thrown away. A relationship is therefore created between groups of coefficients that are multiplied by the same data points at different instants. On this basis, the coefficients may be grouped as $\{A_0, A_4, A_7, A_3\}$, $\{A_3, A_7, A_4, A_0\}$, $\{A_2, A_6, A_5, A_1\}$ and $\{A_1, A_5, A_6, A_2\}$, the same groups as in the interpolating filter case. The convolution, however, is written as follows:

$$\begin{aligned} f &= f_0 + f_1 + f_2 + f_3 \\ &= A_0X_0 + A_4X_4 + A_7X_8 + A_3X_{12} + \\ &\quad A_3X_3 + A_7X_7 + A_4X_{11} + A_0X_{15} + \\ &\quad A_2X_2 + A_6X_6 + A_5X_{10} + A_1X_{14} + \\ &\quad A_1X_1 + A_5X_5 + A_6X_9 + A_2X_{13} \end{aligned}$$

Figure 4:
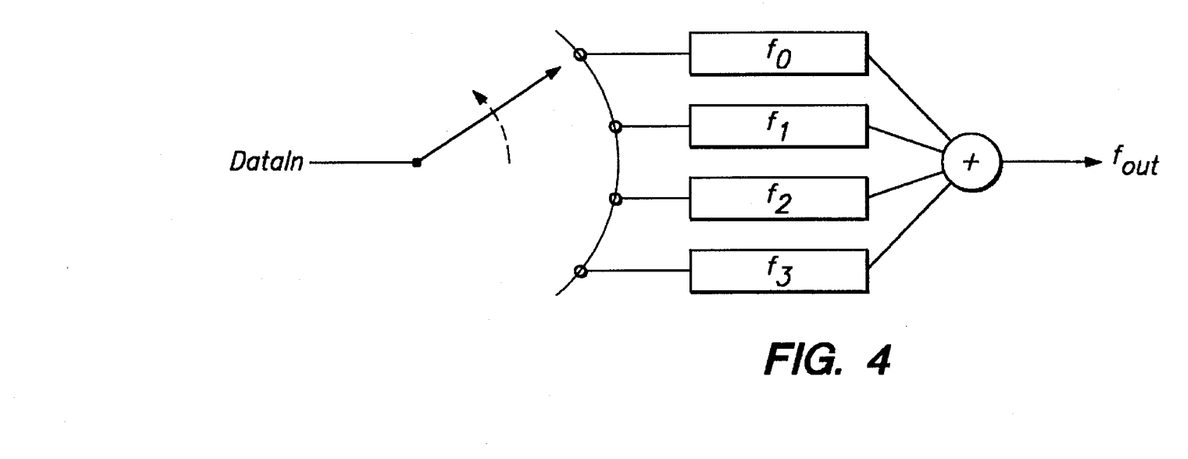
FIG. 4 is a generalized block diagram of a conventional polyphase decimating filter.

A generalized block diagram of a polyphase decimating filter is shown in FIG. 4. The input data points are distributed between the individual filter phases s $f_0$, $f_1$, $f_2$ and $f_3$ using a commutator. One output point of the overall polyphase interpolating filter is formed by summing the output points of each of the individual filter phases.

In the case of both interpolation and decimation, breaking the overall convolution calculation into smaller pieces allows greater computational efficiency to be obtained. However, while the initial N-point filter may be symmetric and can be easily sequenced, the individual N/D-point polyphase filters are not symmetric. This lack of symmetry requires an address sequencer of increased complexity. Furthermore, a filter may require more multiply/accumulate operations than can be accomplished by a single multiplier. The usual approach in such a situation is to add a second multiplier. This approach results in a factor of two increase in area to implement the filter.

SUMMARY OF THE INVENTION

The present invention, generally speaking, achieves a compact FIR filter using one or both of a compact address sequencer and a compact multiplier/accumulator. The address sequencer exploits certain symmetry properties existing between different phases of a polyphase FIR filter in order to reduce coefficient storage and simplify address sequencing. The multiplier/accumulator is capable of performing two multiply/accumulate operations per clock cycle, avoiding in certain instances the need to add a second multiplier/accumulator. The area required to realize a FIR filter for performing real-time filter is therefore reduced.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Considering again the previous example of a 16-point symmetric filter with the coefficients as shown in Table I above, four convolutions must be computed using four filter phases $f_0$, $f_1$, $f_2$ and $f_3$ as follows:

TABLE III

| $f_0$: | $A_3$ | $A_7$ | | $A_4$ | $A_0$ |
| $f_1$: | $A_2$ | $A_6$ | | $A_5$ | $A_1$ |
| $f_2$: | $A_1$ | $A_5$ | | $A_6$ | $A_2$ |
| $f_3$: | $A_0$ | $A_4$ | | $A_7$ | $A_3$ |

While the initial 16-point filter was symmetric and could be easily sequenced, the individual polyphase filters are not symmetric about the usual axis of symmetry, indicated by a dotted line. Symmetry of a different sort is evident, however, between different ones of the polyphase filters. Specifically, $f_0$ is identical to $f_3$ reversed and $f_1$ is identical to $f_2$ reversed.

Assuming, nevertheless, that there were symmetry within the individual polyphase filters about the usual axis of symmetry, the following grouping would obtain:

TABLE IV

| $ef_0$: $(A_4,A_7)$ $(A_0,A_3)$ |
| $ef_1$: $(A_5,A_6)$ $(A_1,A_2)$ |
| $ef_2$: $(A_6,A_5)$ $(A_2,A_1)$ |
| $ef_3$: $(A_7,A_4)$ $(A_3,A_0)$ |

Clearly, symmetry cannot be made to exist where there is none. However, if the paired constants and their corresponding data points could be processed at the same time using a circuit of only marginally greater complexity, then the same speed advantage would be obtained as if the individual polyphase filters were symmetric, without any countervailing disadvantage. Such a circuit would, for example, consume the input pair $(X_0,X_3)$ and produce the result $A_0X_0+A_3X_3$. Furthermore, since reverse symmetry does exist between different polyphase filters about a horizontal axis (again indicated by a dotted line), the potential exists for achieving comparable storage efficiency as if the individual polyphase filters were symmetric. Note that other pair groupings are also possible, the particular pair grouping described being chosen simply for convenience of implementation.

Arithmetic processors are known that compute in a single timestep two products and their sum or difference. For example, MacTaggatt, FFT Butterfly Processor Using Distributed Arithmetic (Electronics Letters, 20 Jan. 1983, Vol. 19, No. 2, pp. 43–44, incorporated herein by reference), describes a design for an arithmetic processor that computes, one at a time, the following two output quantities:

$$Re(Z)=Re(B)Re(W)-Im(B)Im(W)$$

$$Im(Z)=Re(B)Im(W)+Im(B)Re(W)$$

Assume for a moment that instead of computing $Re(Z)$, the complex conjugate $R(Z)^*$ is computed, i.e.:

$$Re(Z)^*=Re(B)Re(W)+Im(B)Im(W)$$

Then, if B and W are assigned such that $B=(X_0+jX_3)$ and $W=(A_0+jA_3)$, the result is:

$$Re(Z)^*=X_0A_0+X_3A_3$$

In this manner, the known arithmetic processor may be used as a multiplier to compute two multiply accumulate steps per clock.

The known arithmetic processor may be readily adapted to perform the foregoing computation. Considering the formation of partial products in an array multiplier, there are only four possible ways in which the separate components of the output Z, considered on a bit-by-bit basis, will be modified by the results of the multiplication operations. These possibilities am set forth in Table VI:

TABLE V

| Bit k Of Input Data Points | | Quantity to be Added to |
|---|---|---|
| $X3_k$ | $X0_k$ | Form kth Partial Product |
| 0 | 0 | 0 |
| 0 | 1 | $A_0$ |
| 1 | 0 | $A_3$ |
| 1 | 1 | $A_0 + A_3$ |

The various quantities in the right-hand column can in turn be represented as the sum or difference of only two quantities, defined as $K_1=(A_0+A_3)/2$ and $K_2=(A_0-A_3)/2$, as follows:

TABLE VI

| Bit k Of Input Data Points | | Quantity to be Added to |
|---|---|---|
| $X3_k$ | $X0_k$ | Form kth Partial Product |
| 0 | 0 | $K_1 - K_1$ |
| 0 | 1 | $K_1 + K_2$ |
| 1 | 0 | $K_1 - K_2$ |
| 1 | 1 | $K_1 + K_1$ |

The left-hand term of each of the quantities in the right-hand column in Table VI is always $K_1$. It can therefore be accounted for by adding $4K_1$ to the result at the outset. Thereafter, the formation of each successive partial product involves only the addition or subtraction of $K_1$ or $K_2$. More particularly, if $X0_k=1$, then $K_1$ or $K_2$ is added, whereas if $X0_k=0$, then $K_1$ or $K_2$ is subtracted. The one of $K_1$ or $K_2$ to be added or subtracted is determined by whether the two input bits of the two data points are equal or not equal. That is, if $X0_k=X3_k$ (as determined by a simple EXOR function) then $K_1$ is selected, and if $X0_k \neq X3_k$ then $K_2$ is selected.

Figure 5:
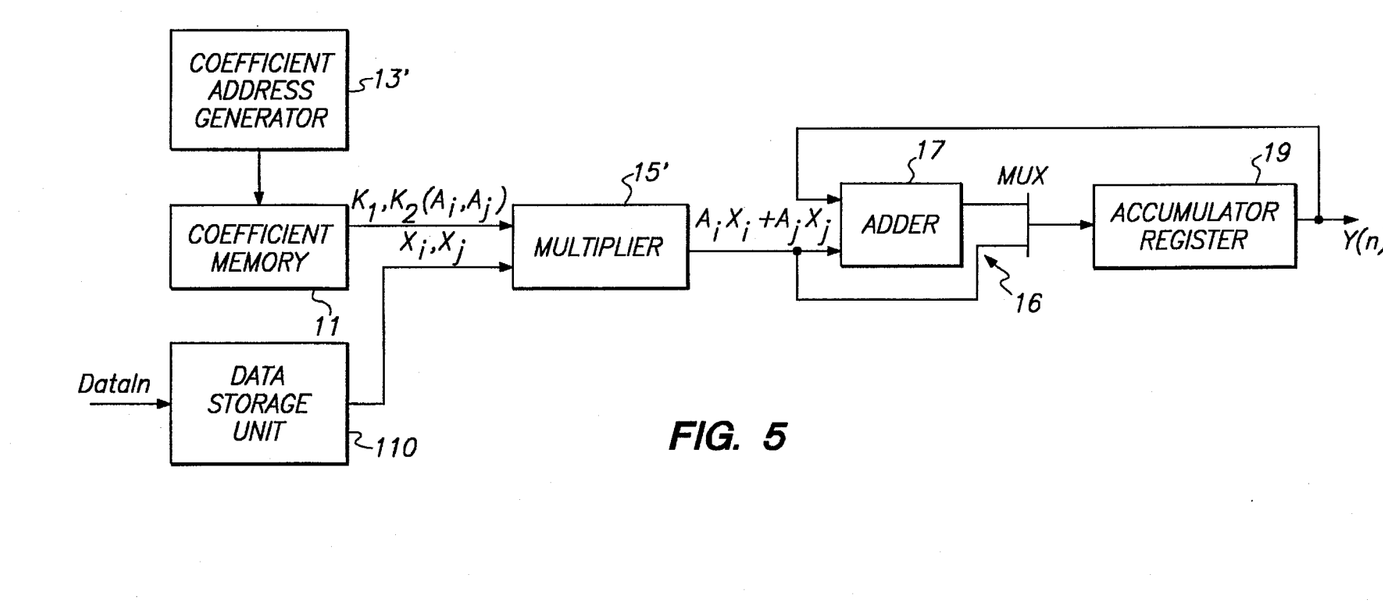
FIG. 5 is a block diagram of a circuit for realizing a polyphase interpolating symmetric FIR filter in accordance with the present invention.

A block diagram of a circuit for realizing an interpolating symmetric FIR filter in accordance with the present invention is shown in FIG. 5. For simplicity and for convenience of description, control circuitry for producing a common clock signal, select signals for the multiplexer 17 and memory control signals for the coefficient address generator 13' and the memory coefficient 11 are not shown. The coefficient memory 11 may be a RAM, a ROM, a PLA, or other form of digital memory.

As compared to the circuit of FIG. 1, in the circuit of FIG. 5, two constants $K_1$ and $K_2$ and two data points $X_i$ and $X_j$ are input to the multiplier circuit 15' at a time. The constants $K_1$ and $K_2$ are derived from the coefficients $A_i$ and $A_k$ as described previously. The two data points $X_i$ and $X_j$ are produced from a data storage unit 110. The multiplier 15' produces the result $A_iX_i+A_jX_j$ during a single timestep. A sequence of such results is accumulated, beginning with the first pair of a given polyphase filter and ending with the last pair of the same polyphase filter, to produce an output point Y(n) of the filter f. Alternatively, the coefficients themselves may be stored in memory and input to the multiplier, in which case circuitry is required for calculating the constants $K_1$ and $K_2$.

Figure 6:
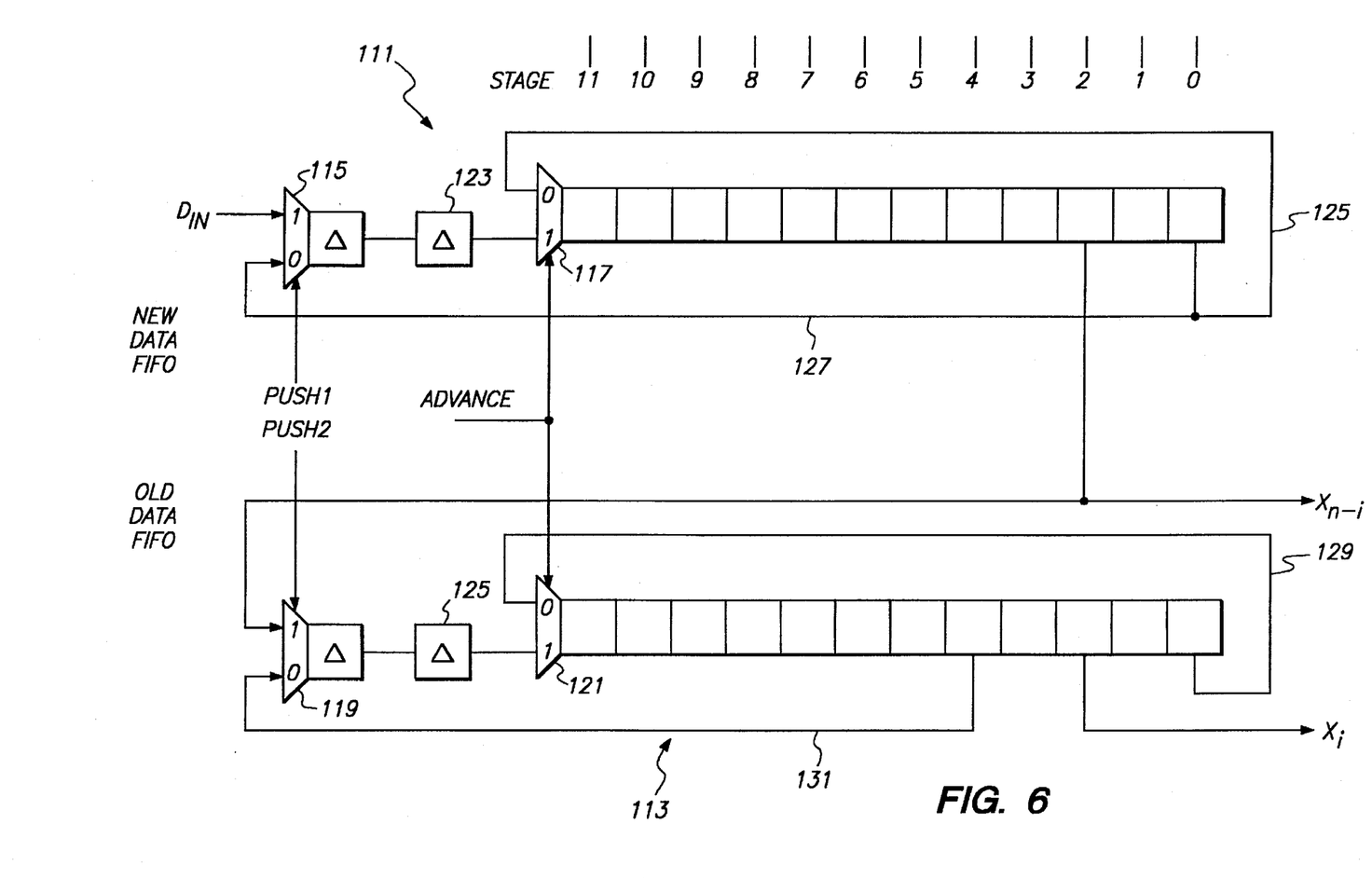
FIG. 6 is a more detailed diagram of the dam storage unit of FIG. 5.

The data storage unit 110 is shown in greater detail in FIG. 6. Because the same data points are used for each phase in the polyphase interpolating filter, the amount of data stored is relatively small. Shift registers may therefore be used to advantage to store the data points. The data storage unit uses two shift registers, a "new data" shift register 111 and an "old data" shift register 113.

Each of the shift registers 111 and 113 has three paths through which input data may be received. The three paths are provided by two two-input multiplexers, multiplexers 115 and 117 for the new data shift register and multiplexers 119 and 121 for the old data shift register. The multiplexers 115 and 119 each have a one-clock delay associated with them. Delay stages 123 and 125, respectively, connect the outputs of the multiplexers 115 and 119 to an input of the multiplexers 117 and 121.

One input of each of the multiplexers 115 and 119 accepts data not previously stored in the respective shift registers 111 and 113. In the case of the new data shift register, this data is a new data input point In the case of the old data shift register, this data is a data point previously stored in and output by the new data shift register at stage 2. Note that the output of each of the shift registers 111 and 113 is taken at stage 2.

The remaining input of each of the multiplexers is coupled by a feedback path to one of the stages of the respective shift registers. In the case of the new data shift register, both the multiplexers 115 and 117 have inputs connected to stage 0, the head of the shift register. In the case of the old data shift register, the multiplexer 121 has an input connected to the head of the shift register. The multiplexer 119, on the other hand, has an input connected to stage 4 of the shift register.

The three data paths through the new data shift register are therefore as follows: (1) from the head of the shift register back through line 125 and through input 0 of multiplexer 117; (2) from the head of the shift register back through line 127, then through .input 0 of multiplexer 115, and through the delay stage 123 and input 1 of multiplexer 117; and (3) from the new data input $D_{IN}$ through input 1 of the multiplexer 115, and through the delay stage 123 and input 1 of multiplexer 117. Path (1) is selected when the control signals Advance and Push 1 are both 0, path (2) is selected when only the Advance signal is 1, and path (3) is selected when the control signal Push 1 is 1 and, either at the same time or subsequently, the control signal Advance is 1.

Similarly the three data paths through the new data shift register are as follows: (1) from the head of the shift register back through line 129 and through input 0 of multiplexer 121; (2) from the stage 4 of the shift register back through line 131, then through input 0 of multiplexer 119, and through the delay stage 125 and input 1 of multiplexer 121; and (3) from the stage 2 output of the new data shift register back through line 133, through input 1 of the multiplexer 115, and through the delay stage 125 and input 1 of multiplexer 121. Path (1) is selected when the control signals Advance and Push2 are both 0, path (2) is selected when only the Advance signal is 1, and path (3) is selected when the control signal Push2 is 1 and, either at the same time or subsequently, the control signal Advance is 1.

During computation of a single output point, the contents of both shift registers 11 and 113 recirculate in the normal fashion. Hence $X_0$ and $X_n$ are presented to the multiplier, followed by $X_1$ and $X_{n-1}$, followed by $X_2$ and $X_{n-2}$, etc. At length, $X_{n/2}$ and $X_{(n/2)+1}$ are presented to the multiplier. These data points are recirculated. In the meantime, however, a new data point $X_{n+1}$ will have been input to the new data shift register behind $X_{(n/2)+1}$ so as to appear next at the output stage 2. The data point $X_{(n/2)+1}$ will have been input to the old data shift register, and the data point $X_0$ discarded. The dam points $X_1$ and $X_{(n/2)+1}$ are then presented to the multiplier, commencing calculation of a new output point. Operation proceeds in this manner.

The data storage unit of FIG. 6 is designed for an 8X, two-channel (I, Q) interpolating filter having a 12-point filter kernel. Referring to the timing diagram of FIG. 7, an illustration is provided of circuit timing beginning with calculation of a first output point and ending after a first portion of calculation of a second output point. The signals in the upper portion of FIG. 7 are shown again in the bottom portion of FIG. 7 beginning at a later time.

Figure 7:
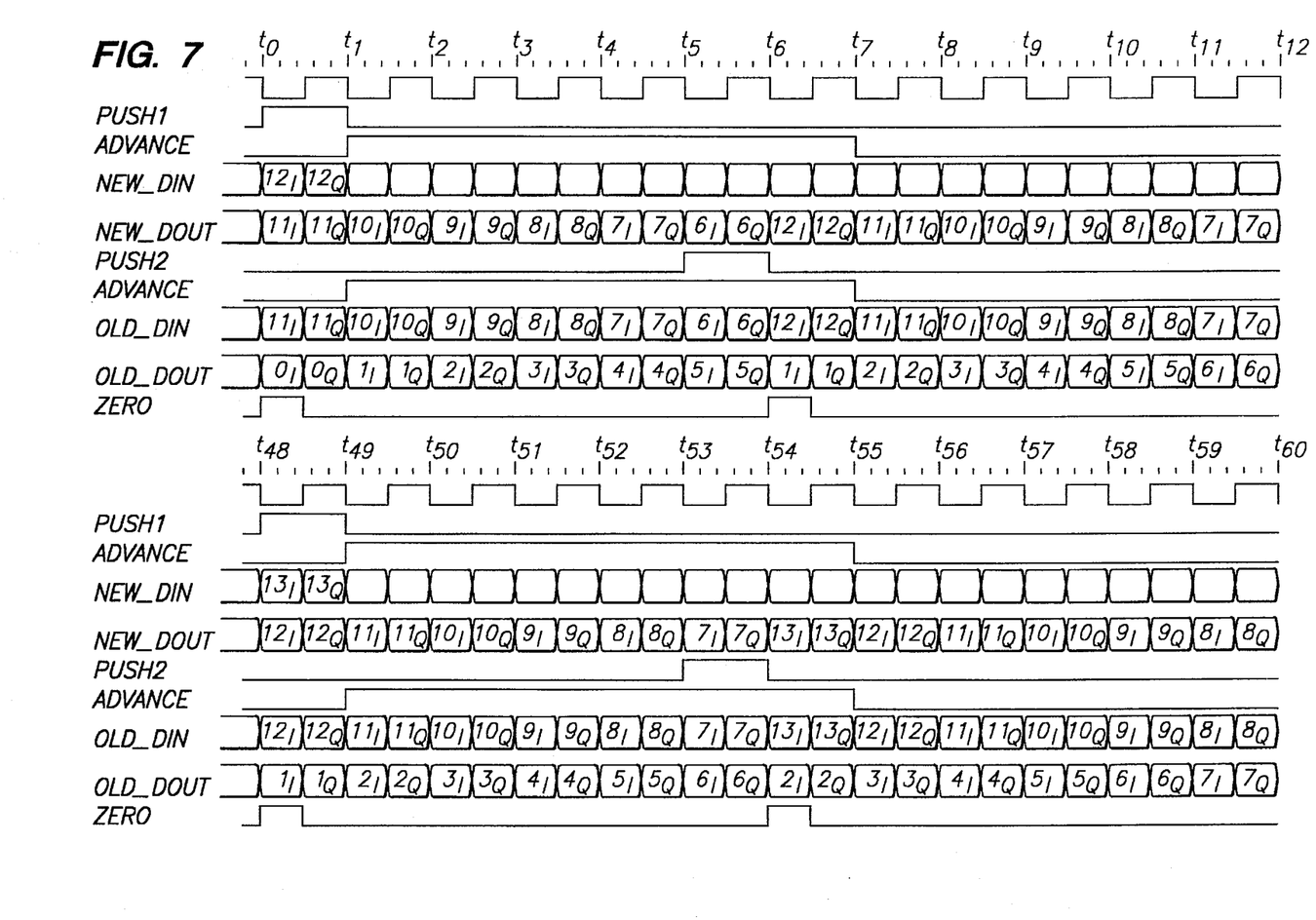
FIG. 7 is a timing diagram of the data storage unit of FIG. 6.

Beginning at time $t_0$, an input data point $11_I$ is assumed to be stored in the output stage, stage 2, of the new data shift register, producing the data point $11_I$ as the output signal NEW_$D_{OUT}$. Succeeding stages 3–11 of the new data shift register are assumed to store the input data points $11_Q$, $10_I$, $10_Q$, ... $7_Q$. Finally, stages 0 and 1 of the new data shift register are assumed to store input data points $6_I$ and $6_Q$. Similarly, at time $t_0$, an input data point $0_I$ is assumed to be stored in the output stage, stage 2, of the old data shift register, producing the data point $0_I$ as the output signal OLD_$D_{OUT}$. Succeeding stages 3–11 of the old data shift register are assumed to store the input data points $0_Q$, $1_I$, $1_Q$, ... $4_Q$. Finally, stages 0 and 1 of the old dam shift register are assumed to store input data points $5_I$ and $5_Q$.

Between time $t_0$ and time $t_1$, the new input data points $12_I$ and $12_Q$ appear on the input line NEW_$D_{IN}$. The signal Push1 is high, while the signal Advance is low. Data is transferred on every clock edge. Therefore, at time $t_1$, the data point $12_I$ will have propagated through the delay of the multiplexer 115 and the additional delay stage 123 to appear at input 1 of the multiplexer 117, the data point $12_Q$ will have propagated through the delay of the multiplexer 115 to appear at the input of the delay stage 123, the data point $6_I$ previously stored in stage 0 will have been circulated through to stage 10, and the data point $6_Q$ previously stored in stage 1 will have been circulated through to stage 11. As for the old data shift register, during the same period of time, the data point $5_I$ previously stored in stage 0 will have been circulated through to stage 10, and the dam point $5_Q$ previously stored in stage 1 will have been circulated through to stage 11. During this period, data points are output as follows: $\{0_I, 11_I\}, \{0_Q, 11_Q\}$.

During the period $t_1$ to $t_5$, the Advance signal only is active high. Data is therefore transferred through dam path (2), line 127 in the case of the new data shift register and line 131 in the case of the old data shift register. Because the line 127 connects to the head of the new data shift register, data remains in order. Considering the delay elements at the end of each shift register as forming the equivalent of two extra stages 12 and 13, data in the new data shift register appears in the sequence (beginning with stage 0) $7_I, 7_Q, 6_I, 6_Q, 12_I, 12_Q, 11_I, 11_Q, 10_I, 10_Q, 9_I, 9_Q, 8_I, 8_Q$. The new data points $12_I, 12_Q$ have been advanced toward the output stage, stage 2, in preparation for beginning calculation of a new data output point. During this period, data points am output as follows: $\{1_I, 10_I\},\{1_Q, 10_Q\},\{ 2_I, 9_I\}, \{2_Q, 9_Q\}, \{3_I, 8_I\}, \{3_Q, 8_Q\}, \{4_I, 7_Q\}, \{4_Q, 7_Q\}$.

The line 13 1, however, connects to stage 4 of the old data shift register. Data in the old data shift register therefore appears in the sequence (beginning with stage 0) $4_I, 4_Q, 5_I, 5_Q, 1_I, 1_Q, 2_1, 2_Q, 3_I, 3_Q, 4_I, 4_Q, 5_I, 5_Q$.

During the time period $t_5$ to $t_6$, Advance remains active high and Push2 also becomes active high. Data is therefore transferred through data path (3) of the old data shift register. Push1, however, remains low such that data continues to be transferred through data path (2) of the new data shift register. Data points are output as follows: $\{5_I, 6_I\}, \{5_Q, 6_Q\}$. Data in the new data shift register appears in the sequence (beginning with stage 0) $6_I, 6_Q, 12_I, 12_Q, 11_I, 11_Q, 10_I, 10_Q$, $9_I$, $9_Q$, $8_I$, $8_Q$, $7_I$, $7_Q$. Data in the old data shift register appears in the sequence (beginning with stage 0) $5_I$, $5_Q$, $1_I$, $1_Q$, $2_I$, $2_Q$, $3_I$, $3_Q$, $4_I$, $4_Q$, $5_I$, $5_Q$, $6_I$, $6_Q$, the latter two data points having been pushed from stage 2 of the new data shift register into the delay pipeline of the old data shift register. Calculation of a new output data point is now ready to begin by outputting $\{1_I, 12_I\}$, $\{1_Q, 12_Q\}$, etc. Data is advanced in both shift registers for one more cycle (from $t_6$ to $t_7$) to move the data points $7_I$, $7_Q$ and $6_I$, $6_Q$ from the delay pipelines into the shift registers proper.

Once the foregoing output data sequence has been produced once, it is repeated seven additional times for a total of eight times, once for each phase of the 8X interpolating filter. The data sequence is repeated for the final time during the period $t_{48}$ to $t_{54}$. Also during this time period, new input data points $13_I$ and $13_Q$ are advanced in preparation for calculating a new output data point.

Figure 8:
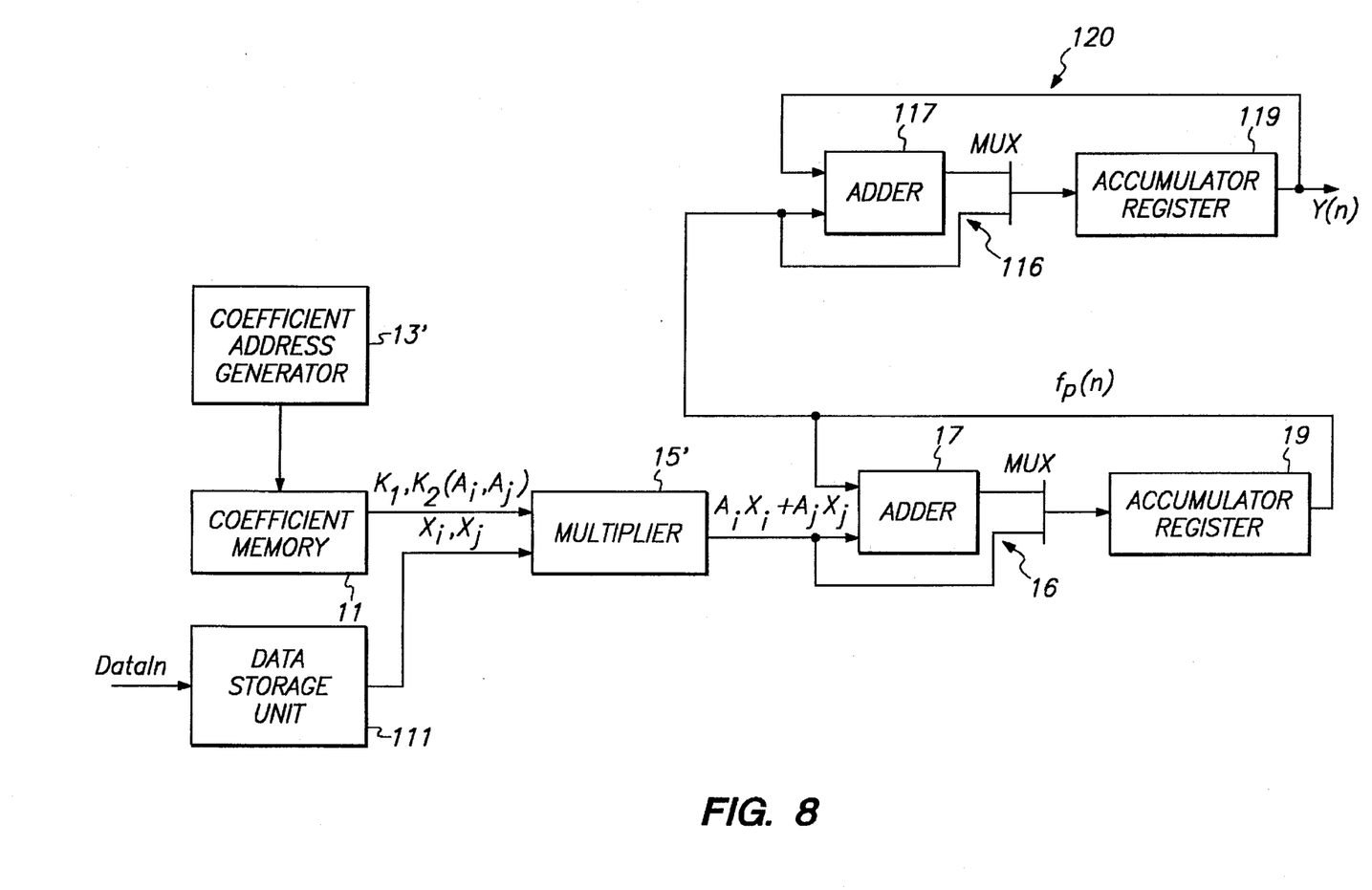
FIG. 8 is a block diagram of a circuit for realizing a polyphase decimating symmetric FIR filter in accordance with the present invention.

A block diagram of a circuit for realizing a decimating symmetric FIR filter in accordance with the present invention is shown in FIG. 8. Again, for simplicity and for convenience of description, control circuitry for producing a common clock signal, select signals for the multiplexer 17 and memory control signals for the coefficient address generator 13' and the memory coefficient 11 are not shown. The coefficient memory 11 may be a RAM, a ROM, a PLA, or other form of digital memory.

As compared to the circuit of FIG. 5, in the circuit of FIG. 8, there is provided an additional accumulator 120 including an adder 117, a multiplexer 116 and an accumulator register 119. Recall that, whereas in the case of an interpolating filter the filter output is one of the phase outputs, in the case of a decimating filter, the filter output is the sum of the phase outputs. Accordingly, the different phase outputs $f_p(n)$ are accumulated in the accumulator 120 to form the filter output Y(n).

Figure 9:
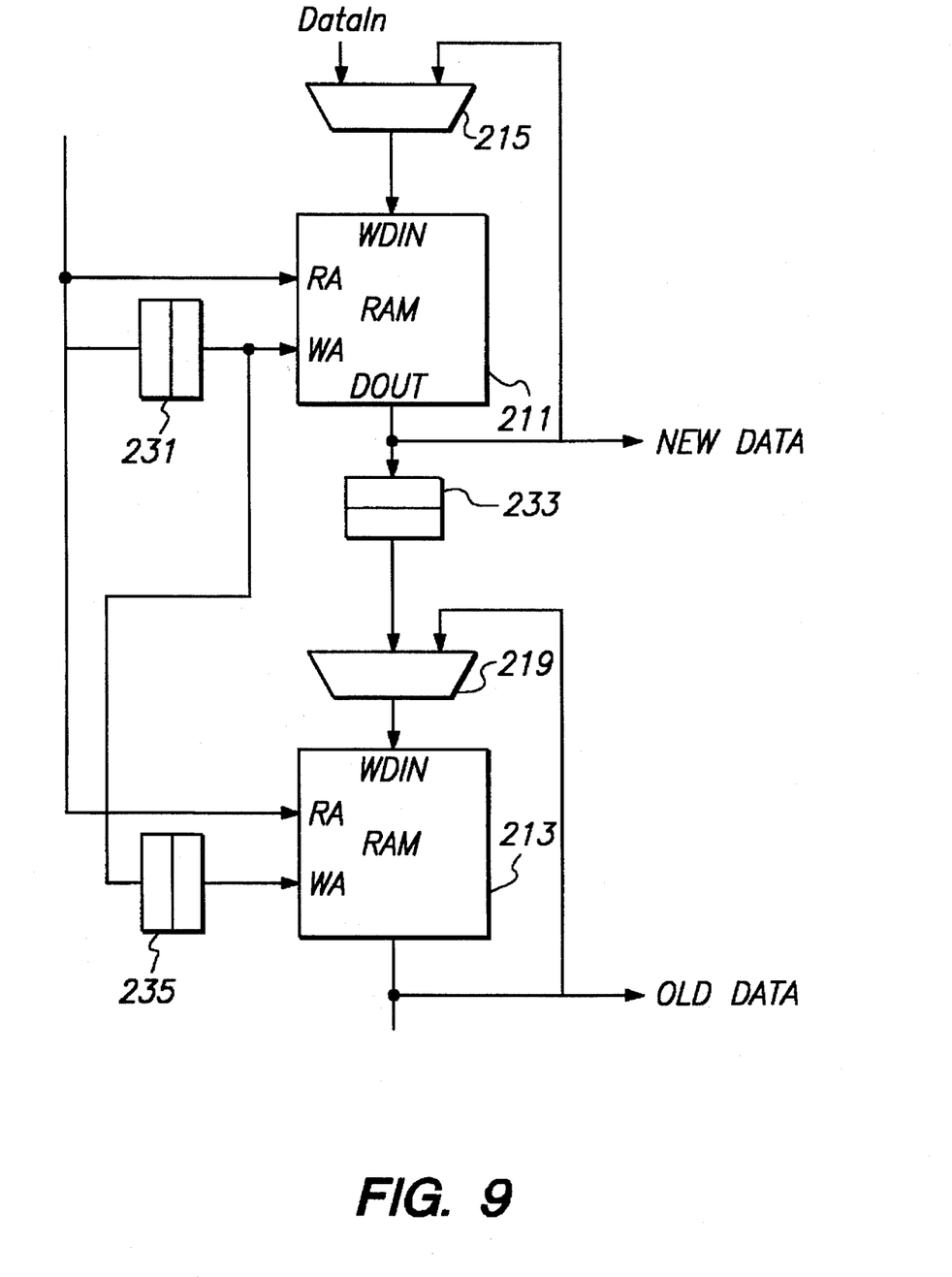
FIG. 9 is a more detailed diagram of the data storage unit of FIG. 8.

The data storage unit 111 is shown in greater detail in FIG. 9. A similar approach is used as in the case of the interpolating filter. However, since in the case of a decimating filter different data is stored for each filter phase, two random access memories 211 and 213 are used instead of the two shift registers 111 and 113 of the data storage unit for the interpolating filter. Because of the random access nature of the memories (as compared to shift registers), the implementation becomes relatively simple. A multiplexer 215 at the data input of the new data queue 211 is used to select between either a new input data point or a data point previously output from the queue. A multiplexer 219 at the data input of the old data queue 23 1 is used to select between either an input data point from the new data queue or a data point previously output from the old data queue. Write operations are delayed by two clocks using delay elements 23 1,233 and 235 to ensure that data is not overwritten before it gets mad out.

In an exemplary embodiment, the data storage unit is used to realize a two-channel, 8X symmetric decimating filter. Corresponding I and Q data is stored side-by-side at a single memory address. Half of the data is stored in the new data queue and half of the data is stored in the old data queue. Therefore, to calculate a 96-point filter for example, 48 address locations are required in each memory. The 96-point filter may be composed into eight 12-point filter phases, six data points of which are stored in the new data queue and six data points of which are stored in the old data queue. The 48 address locations of each memory are therefore grouped in groups of six, 0–5, 6–11, etc. A free-running mod-47 counter (not shown) is used to repeatedly count from 0 to 47. A coefficient address generator (also not shown) is used to read out the coefficients of each respective phase of the eight filter phases once during one cycle of the data address counter from 0 to 47.

Table IV illustrates operation of the data storage trait from when calculation of one output data point has been completed to when calculation of a next output data point has begun.

TABLE VII

| PREVIOUS STATE | | | | NEXT STATE | | | |
|---|---|---|---|---|---|---|---|
| NEW DATA QUEUE | | OLD DATA QUEUE | | NEW DATA QUEUE | | OLD DATA QUEUE | |
| ADDRESS | DATA | ADDRESS | DATA | ADDRESS | DATA | ADDRESS | DATA |
| 0 | D11 | 0 | D0 | 0 | D12 | 0 | D1 |
| 1 | D10 | 1 | D1 | 1 | D11 | 1 | D2 |
| 2 | D9 | 2 | D2 | 2 | D10 | 2 | D3 |
| 3 | D8 | 3 | D3 | 3 | D9 | 3 | D4 |
| 4 | D7 | 4 | D4 | 4 | D8 | 4 | D5 |
| 5 | D6 | 5 | D5 | 5 | D7 | 5 | D6 |

Figure 10:
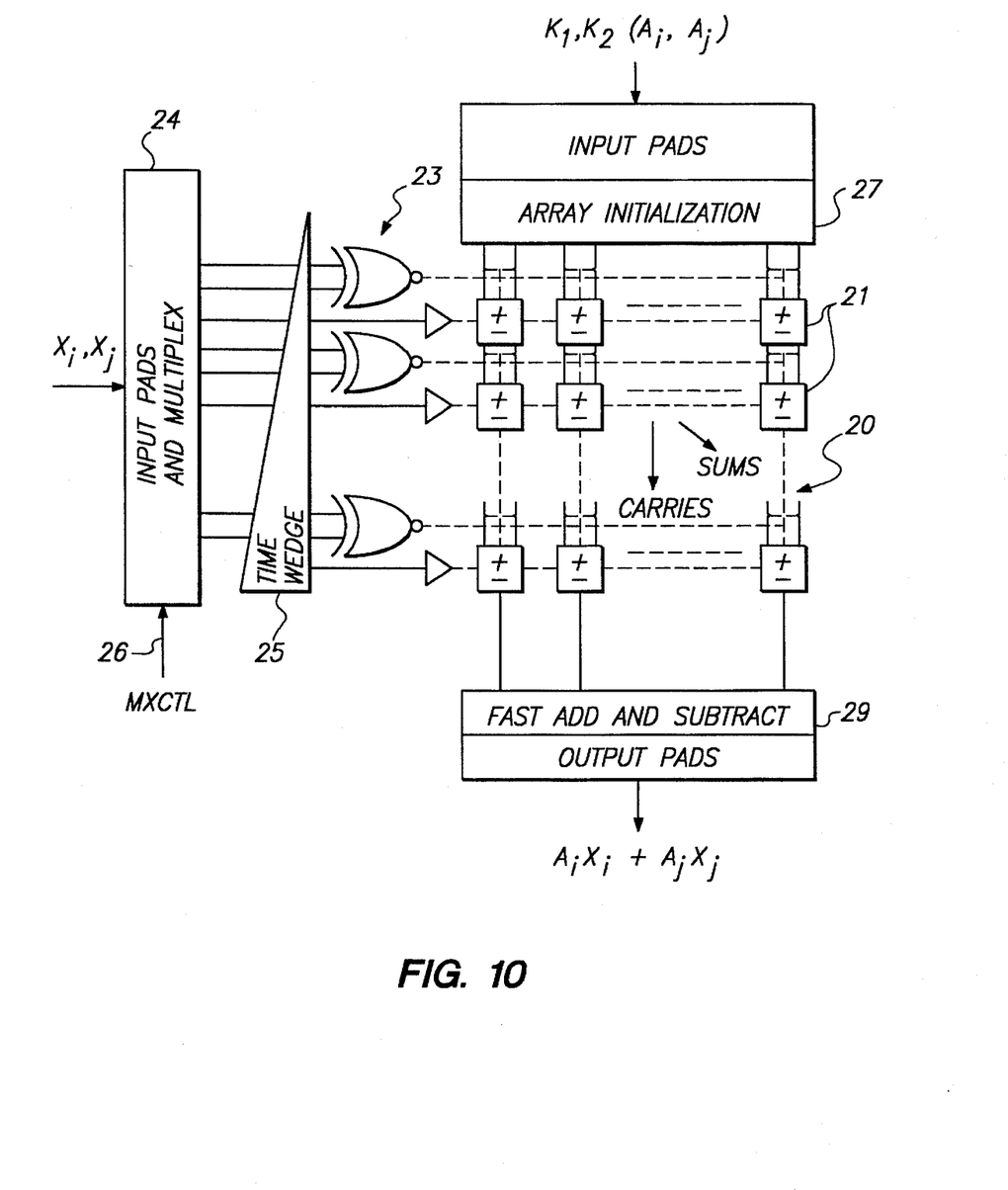
FIG. 10 is a more detailed block diagram of the multiplier of FIG. 5 and FIG. 8.

The multiplier 15' is shown in greater detail in FIG. 10. Preferably, the multiplier is realized in the form of an integrated circuit, or IC chip, and is based on a two-dimensionally pipelined configuration which allows the constant throughput of parallel data.

The multiplier incorporates an array 20 of basic cells 21, each of which includes a two-bit-wide shift register and a full adder. The basic cells are interconnected as indicated with carry bits being propagated directly downward to a next cell and sum bits being propagated downward and one cell to the fight. The input words $K_1$ and $K_2$ are shifted separately from "top-to-bottom" of the multiplier through the array of full adders. A data select on the two input words $K_1$ and $K_2$ is performed at the inputs to each full adder under the control of an Exclusive OR or Exclusive NOR block 23 which operates on the separate bits of $X_i$ and $X_j$ as described previously in relation to Table VI. The word selected (i.e., either $K_1$ or $K_2$) at each full adder is then either added to, or subtracted from, the accumulated partial product as determined by the appropriate bit of $X_j$. A "time wedge" 25 (collection of pipeline registers) is connected to the $X_i$, $X_j$ input port to ensure that a constant data throughput can be maintained in the pipeline.

Figure 11:
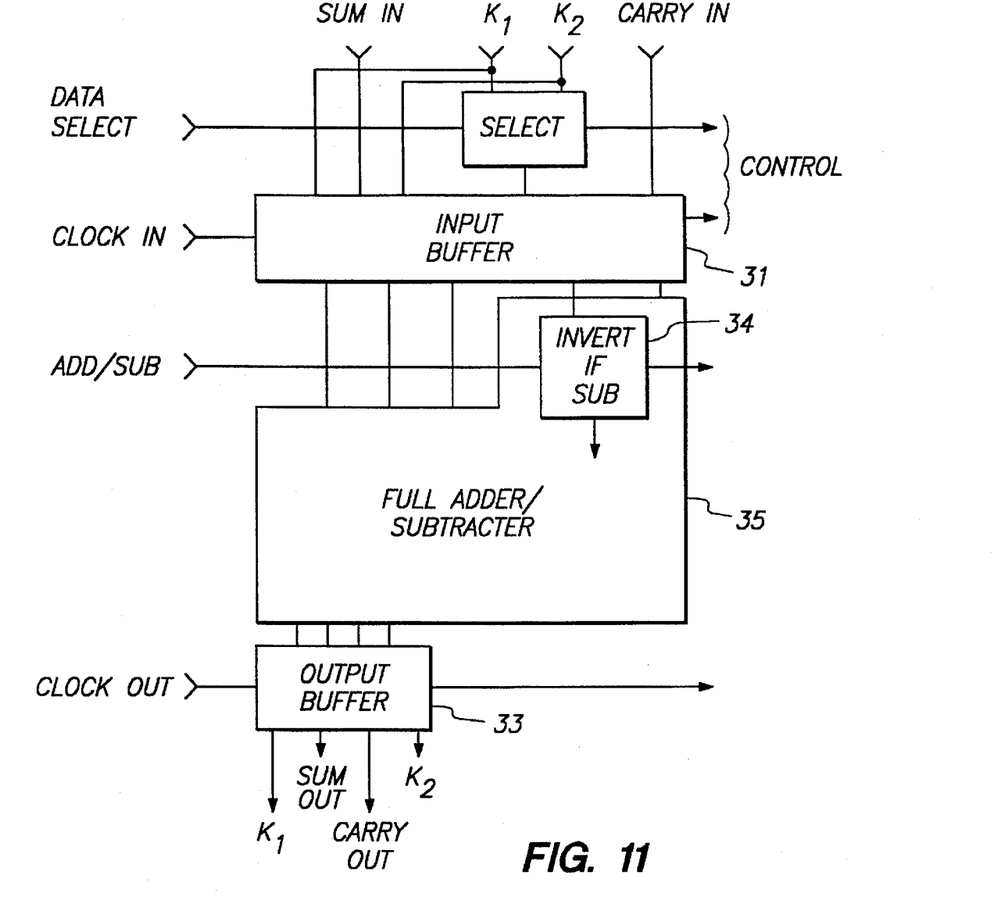
FIG. 11 is a more detailed block diagram of the basic cell of the multiplier of FIG. 10.

Referring to FIG. 11, a basic cell 21 is realized using a combination of inverters, buffers, and a full adder/subtracter 35. Data inputs to the cell include $K_1$ and $K_2$, a sum input signal (sum in), and a carry input signal (carry in), while data outputs from the cell include a sum output signal (sum out), and a carry input signal (carry out). In the case of all but the first row of cells, sum in and carry in are connected to sum out from one cell in the preceding row and carry out from another cell in the preceding row. In the case of the first row of cells, sum in and carry in are connected to $K_1$, shifted so as to accomplish a multiplication by four. This array initialization is accomplished within block 27 of FIG. 10.

Control inputs to the cell include clock in and clock out inputs, a data select input, an add/subtract input.

In operation, the dam select line is set in accordance with the bits of $X_i$ and $X_j$ so as select the appropriate one of $K_1$ and $K_2$. When data select is true, $K_1$ is selected, and when data select is false, $K_2$ is selected. The inputs are then clocked by the input clock and driven by the input buffer 31. Meanwhile, add/sub will have been set in accordance with the appropriate bit of $X_j$ so as to cause the circuit 35 to operate as either an adder or subtracter. Block 34 performs this function.

Once add/sub has been set and the inputs have been driven, the remainder of circuit 35 then computes the sum or difference. When the output clock is activated, sum out and carry out are driven with the results of the computation by the buffer 33. As for the outputs $K_1$ and $K_2$, the buffers 31 and 33 realize the two-bit shift register mentioned previously, whereby $K_1$ and $K_2$ are shifted from stage to stage.

Once the last row of cells has performed its addition or subtraction, a final summation is performed in block 29 of FIG. 10 to produce the final output. Note that although operation has been described in terms of multiplication/accumulation with respect to one data point pair and its correspond coefficient pair, because of the fully pipelined nature of the circuit of FIG. 10, once the pipeline has been filled, the result of a different multiplication/accumulation operation is produced each clock cycle.

Referring again to Table IV, as previously noted, reverse symmetry exists between different polyphase filters about the horizontal axis (indicated by the dotted line). In accordance with one embodiment of the invention, this property is exploited in order to achieve comparable storage efficiency as if the individual polyphase filters were symmetric. Considering again the example of calculating $Re(Z)^* = X_0 A_0 + X_3 A_3$, if the input operands $X_3$ and $X_0$ are interchanged before being applied to the multiplier, then the multiplier's output will instead be $Re(Z)^* = X_0 A_3 + X_3 A_0$. This is precisely the result required when calculating the polyphase filter $ef_3$. More generally, Table IV can be rewritten in the following form:

TABLE VIII

| | | |
|---|---|---|
| $ef_0$: | $(A_4, A_7)$ | $(A_0, A_3)$ |
| $ef_1$: | $(A_5, A_6)$ | $(A_1, A_2)$ |
| $ef_2$: | $(A_5, A_6)\leftrightarrows$ | $(A_1, A_2)\leftrightarrows$ |
| $ef_3$: | $(A_4, A_7)\leftrightarrows$ | $(A_0, A_3)\leftrightarrows$ |

The subscript "$\leftrightarrows$" in the lower half of the table denotes that the input operands are reversed as compared to their order during the calculations represented in the upper half of the table. In this manner, it is possible to achieve the effect of accessing a filter's coefficients in the reverse order, which is required for reducing the size of the coefficient memory storage.

In addition to achieving the effect of accessing a filter's coefficients in the reverse order within a pair, the coefficients pairs in the lower half of the table must be accessed in the reverse phase order from the coefficients pairs in the upper half of the table. For example, if the coefficients pairs $(A_0, A_3)_{ph0}$, $(A_4, A_7)_{ph0}$, $(A_1, A_2)_{ph1}$ and $(A_5, A_6)_{ph1}$ were stored at memory addresses 0, 1, 2, and 3, respectively and were accessed in that order to calculate phases $ef_0$ and $ef_1$, in order to thereafter calculate phases $ef_3$ and $ef_4$, the same coefficients pairs must be accessed in the reverse phase order, i.e., $(A_1, A_2)_{ph1}$, $(A_5, A_6)_{ph1}$, $(A_0, A_3)_{ph0}$ and $(A_4, A_7)_{ph0}$, corresponding to memory addresses 2, 3, 0 and 1.

An address sequencer for producing the foregoing sequencing may consist of two counter, a modulo-m counter, where m is the number of coefficients pairs in a polyphase filter branch, and a binary counter.

Figure 12:
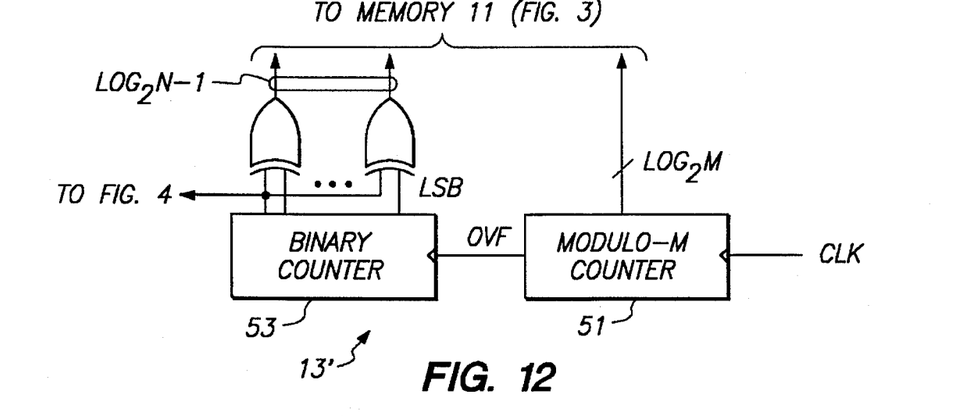
FIG. 12 is a more detailed block diagram of the coefficient address generator of FIG. 5 and FIG. 8.

Referring to FIG. 12, the modulo-m counter 51 is clocked at the computer rate of the multiplier. The binary counter 53 counts from 0 to n−1, where n is the number of filter branches, and is clocked whenever the modulo-m counter overflows. The binary counter 53 therefore progressively addresses sections of memory in which sets of coefficient pairs for the various filter branch are stored, and the modulo-m counter 51 progressively addresses the particular coefficient pairs within each set. The MSB of the binary counter 53 is not used to address the coefficient memory but is used as a control signal. That is, when the MSB of the binary counter 53 is asserted, it indicates that the lower half of the coefficient table is to then be accessed. In order to access the lower half of the coefficient table in reverse phase order, the remaining bits of the binary counter 53 are XORed with the MSB and are thereby inverted. The MSB is also input to the input pad and multiplex block 24 in FIG. 10 as a control signal MXCTL. This signal is used to reverse the order of the input operands.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of calculating output data points of a polyphase Finite Impulse Response filter using a complex multiplier, comprising the steps of:

a) applying to the complex multiplier a pair of constants $K_1$ and $K_2$ different from but related to a pair of filter coefficients $A_i$ and $A_j$;

b) applying to the complex multiplier a pair of input operands $X_i$ and $X_j$; and c) operating the complex multiplier to form the quantity $A_i X_i + A_j X_j$.

2. The method of claim 1 wherein $K_1 = (A_i + A_j)/2$ and $K_2 = (A_i - A_j)/2$.

3. The method of claim 2, comprising the further step of:

d) repeating step a) through step c) with different index values i and j.

4. The method of claim 3, wherein step b) comprises applying $X_i$ to a first operand input of the complex multiplier and applying $X_j$ to a second operand input of the complex multiplier.

5. The method of claim 4, comprising the further step of:

e) repeating step a) through step c) with the same index values i and j as during a previous iteration of step a) through step c).

6. The method of claim 5, wherein step e) comprises applying $X_i$ to said second operand input of the complex multiplier and applying $X_j$ to said first operand input of the complex multiplier.

7. The method of claim 3, comprising:

d1) repeating step a) through step d) for each of a plurality of sets of index value pairs.

8. The method of claim 7, wherein step b) comprises applying $X_i$ to a first operand input of the complex multiplier and applying $X_j$ to a second operand input of the complex multiplier.

9. The method of claim 8, comprising the further step of:
   e) repeating step a) through step d) for each of a plurality of sets of index value pairs, with the same index values i and j as during step d1)).

10. The method of claim 9, wherein step e) comprises applying $X_i$ to said second operand input of the complex multiplier and applying $X_j$ to said first operand input of the complex multiplier.

11. The method of claim 10, wherein said plurality is a number N/2 where N is an even number, step d1)) comprising repeating step a) through step d) first for a set $S_1$ of index value pairs and last for a set $S_{N/2}$ of index value pairs, and step e) comprising repeating step a) through step d) first for a set $S_{N/2}$ of index value pairs and last for a set $S_1$ of index value pairs.

12. A apparatus for calculating output data points of a digital filter comprising:
   a memory storing a plurality of filter-coefficient-related constants and for storing a plurality of input data points;
   an address generator connected to said memory; and
   a complex multiplier/accumulator connected to said memory and having a first input port, a second input port and an output port, said complex multiplier/accumulator receiving at said first input port signals representing a pair of constants different from but related to filter coefficients $A_i$ and $A_j$, receiving at said second input port signals representing a pair of input data points $X_i$ and $X_j$, and producing at said output port signals representing the quantity $A_iX_i+A_jX_j$.

13. The apparatus of claim 12, wherein said complex multiplier/accumulator comprises an array of interconnected basic cells arrayed in rows and columns, each row of said basic cells forming a different intermediate multiply/accumulate result.

14. The apparatus of claim 13, wherein said complex multiplier/accumulator further comprises a control circuit for generating for each row of said basic cells a select signal in accordance with corresponding single bits of $X_i$ and $X_j$.

15. The apparatus of claim 14, wherein said control circuit further generates for each row of said basic cells a add/subtract signal in accordance with a corresponding single bit of one of $X_i$ and $X_j$.

16. The apparatus of claim 15, wherein each of said basic cells comprises a multiplexer responsive to said select signal for a row of said basic cell for selecting a bit from one of said pair of constants related to filter coefficients Ai and Aj, and a full adder/subtracter receiving a sum input signal and a carry input signal from adjacent basic cells and responsive to said add/subtract signal for said row of said basic cell for adding or subtracting said bit to or from a radix-2 quantity represented by said sum input signal and said carry input signal to produce a sum output signal and a carry output signal.

17. The apparatus of claim 12, wherein said address generator generates a mux control signal and said complex multiplier/accumulator comprises a multiplexer responsive to said mux control signal for selectively interchanging at said second input port said signals representing said pair of input data points $X_i$ and $X_j$.

18. The apparatus of claim 17, wherein said address generator comprises:
   first means operating at a first rate $R_1$ for repeatedly generating a symmetric sequence of binary numbers $H_0, H_2, \ldots, H_{N-1}$ where $H_q = H_{N-1-q}$;
   second means connected to said first means and operating at a second rate $R_2 = MR_1$ for repeatedly generating a monotonic sequence of binary numbers $L_0, L_2, \ldots, L_{M-1}$ where M is an integer; and
   third means connected to said first and second means for forming a concatenation HL of one of said symmetric sequence of binary numbers and one of said monotonic sequence of binary numbers as a address for said memory.

19. The apparatus of claim 18, wherein said first means comprises a binary counter and a plurality of EXOR gates each connected to different output bits of said binary counter and each connected also to a same output bit of said binary counter of greater significance than said different output bits.

20. The apparatus of claim 19, wherein said second means comprises a modulo-M counter clocked by a clock signal and producing an overflow signal, said overflow signal being connected to clock said binary counter.

* * * * *